(12) United States Patent
Lee et al.

(10) Patent No.: US 10,418,389 B2
(45) Date of Patent: Sep. 17, 2019

(54) DISPLAY DEVICE

(71) Applicant: LG Display Co., LTD., Seoul (KR)

(72) Inventors: NeungHee Lee, Seoul (KR); HoYoung Lee, Paju-si (KR); JongMoo Ha, Paju-si (KR); ByoungHyun Koo, Seoul (KR); KyuRi Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/035,100

(22) Filed: Jul. 13, 2018

(65) Prior Publication Data

US 2019/0096913 A1 Mar. 28, 2019

(30) Foreign Application Priority Data

Sep. 28, 2017 (KR) .................. 10-2017-0126496

(51) Int. Cl.
*H01L 29/06* (2006.01)
*H01L 27/12* (2006.01)
*H01L 27/32* (2006.01)
*H01L 51/52* (2006.01)
*H05K 7/20* (2006.01)
*H01L 51/00* (2006.01)

(52) U.S. Cl.
CPC ........ *H01L 27/124* (2013.01); *H01L 27/1218* (2013.01); *H01L 27/3276* (2013.01); *H01L 51/0097* (2013.01); *H01L 51/529* (2013.01); *H01L 51/5281* (2013.01); *H05K 7/20963* (2013.01); *H01L 51/5253* (2013.01); *H01L 2251/5338* (2013.01)

(58) Field of Classification Search
CPC ............. H01L 27/3276; H01L 27/1218; H01L 27/124; H01L 51/0097; H01L 51/5281; H01L 51/529
USPC ........................................... 257/72
See application file for complete search history.

(56) References Cited

U.S. PATENT DOCUMENTS

| 9,326,375 B2 * | 4/2016 | Lee .................. H05K 1/028 |
| 2015/0036300 A1 * | 2/2015 | Park .................. H05K 1/147 361/749 |
| 2016/0306488 A1 * | 10/2016 | Kim .................. G06F 3/0416 |

* cited by examiner

*Primary Examiner* — Luan C Thai
(74) *Attorney, Agent, or Firm* — Birch, Stewart, Kolasch & Birch, LLP (57) ABSTRACT

A display device in one embodiment includes a flexible substrate, a back plate disposed under the flexible substrate to support it, a conductive layer disposed on at least one surface of the back plate, and a printed circuit board connected to one side of the flexible substrate. The conductive layer is electrically connected to the printed circuit board and receives a constant voltage applied thereto. Therefore, by applying the constant voltage to the conductive layer, it is possible to reduce the polarization occurring on the flexible substrate.

15 Claims, 6 Drawing Sheets

DISPLAY DEVICE

CROSS-REFERENCE TO RELATED APPLICATIONS

This application claims the priority of Korean Patent Application No. 10-2017-0126496 filed on Sep. 28, 2017, in the Korean Intellectual Property Office, the disclosure of which is incorporated herein by reference.

BACKGROUND

Technical Field

The present disclosure relates to a display device, and more particularly, to a display device that improves residual image issues due to an electric field formed on a substrate of the display device.

Description of the Related Art

Display devices employed by the monitor of a computer, a TV, a mobile phone or the like include an organic light-emitting display (OLED) that emits light by itself, and a liquid-crystal display (LCD) that requires a separate light source.

Lately, a flexible display device is attracting attention as the next generation display device. Such a flexible display device is fabricated by forming a display unit, wiring, etc. on a flexible substrate made of a flexible material such as plastic so that it is able to display images even if it is bent, like paper.

Such flexible display devices find more and more applications, including computer monitors and televisions, as well as personal portable devices. Accordingly, research is ongoing to develop flexible display devices having a larger display area with reduced volume and weight.

SUMMARY

On the flexible substrate of such a flexible display device, a plurality of wirings such as gate wirings, data wirings, and power wirings are disposed. An electric field is formed due to the influence of adjacent wirings. The inventors of the present application have recognized that such electric field formed on the flexible substrate can result in a polarization on the flexible substrate. The inventors of the present application have recognized that the polarization occurring on the flexible substrate can affect various elements and circuits disposed on the flexible substrate. In particular, the inventors of the present application have recognized that when a polarization occurs in the flexible substrate, a current flowing in a thin-film transistor disposed on the flexible substrate is changed, thereby resulting in residual image issues.

In view of the above, the inventors of the present application have devised a display device having a novel structure that can suppress the properties of thin-film transistors from being changed due to the polarization that can occur on the flexible substrate and residual images are generated.

An object of the present disclosure is to provide a display device that improves residual image issues by suppressing changes in the characteristics of thin-film transistors due to the polarization occurring on the flexible substrate.

Another object of the present disclosure is to provide a display device that improves residual image issues by weakening influence on the channel region of thin-film transistors by the electric field formed under the thin-film transistors.

It should be noted that objects of the present disclosure are not limited to the above-described objects, and other objects of the present disclosure will be apparent to those skilled in the art from the following descriptions.

According to an aspect of the present disclosure, there is provided a display device including a flexible substrate, a back plate disposed under the flexible substrate to support the flexible substrate, a conductive layer disposed on at least one surface of the back plate, and a printed circuit board connected to one side of the flexible substrate. The conductive layer is electrically connected to the printed circuit board and receives a constant voltage applied thereto. Therefore, by applying the constant voltage to the conductive layer, it is possible to reduce the polarization occurring on the flexible substrate.

According to another aspect of the present disclosure, there is provided a display device including a flexible substrate having an active area and a non-active area having a bending area, a printed circuit board connected to one side of the flexible substrate, and a polarization-mitigating structure for supporting the active area and the non-active area of the flexible substrate excluding the bending area, and receiving a voltage from the printed circuit board.

The details of one or more embodiments of the subject matter described in this specification are set forth in the accompanying drawings and the description below.

According to an exemplary embodiment of the present disclosure, a polarization occurring on a flexible substrate can be mitigated, so that changes in the characteristics of the thin-film transistors disposed on the flexible substrate can be reduced.

Further, according to an exemplary embodiment of the present disclosure, current variations and residual image defects resulting from the electric field in the flexible substrate can be suppressed or eliminated.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENTS

Advantages and features of the present disclosure and methods to achieve them will become apparent from the descriptions of exemplary embodiments hereinbelow with reference to the accompanying drawings. However, the present invention is not limited to exemplary embodiments disclosed herein but can be implemented in various different ways. The exemplary embodiments are provided for making the disclosure of the present invention thorough and for fully conveying the scope of the present invention to those skilled in the art. It is to be noted that the scope of the present invention is defined only by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies can be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B," and "an element A next to an element B," another element C can be disposed between the elements A and B unless the term "directly" or "immediately" is explicitly used.

As used herein, a phrase "an element A on an element B" refers to that the element A can be disposed directly on the element B and/or the element A can be disposed indirectly on the element B via another element C.

As used herein, the terms first, second, etc., are used for distinguishing between similar elements and not necessarily for describing a sequential or chronological order. These terms are used to merely distinguish one element from another. Accordingly, as used herein, a first element can be a second element within the technical scope of the present disclosure.

Like reference numerals denote like elements throughout the descriptions.

The drawings are not to scale and the relative dimensions of various elements in the drawings are depicted schematically and not necessarily to scale.

Features of various exemplary embodiments of the present disclosure can be combined partially or totally. As will be clearly appreciated by those skilled in the art, technically various interactions and operations are possible. Various exemplary embodiments can be practiced individually or in combination.

Hereinafter, exemplary embodiments of the present disclosure will be described in detail with reference to the accompanying drawings.

Figure 1:
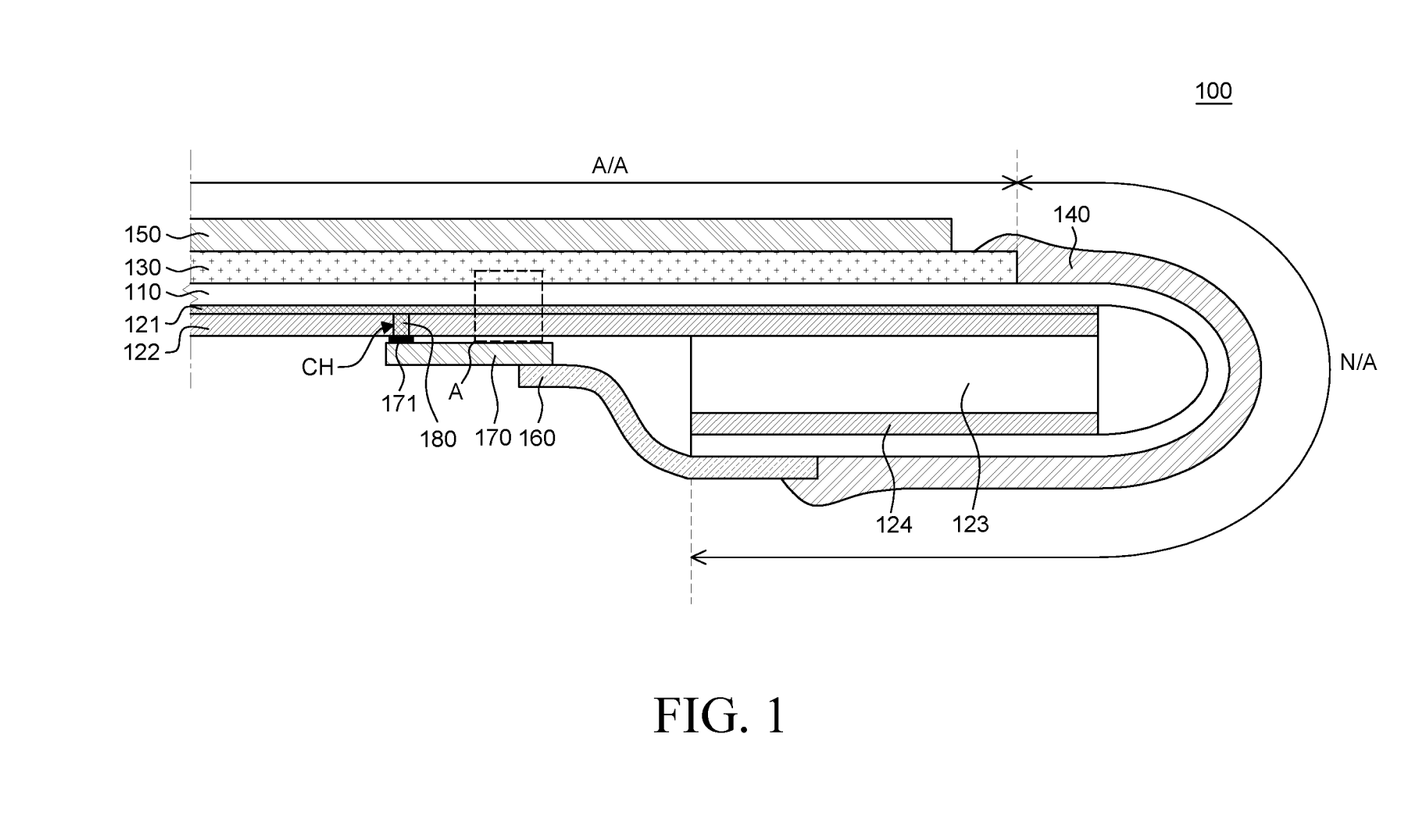
FIG. 1 is a cross-sectional view of a display device according to an exemplary embodiment of the present disclosure.

FIG. 1 is a cross-sectional view of a display device according to an exemplary embodiment of the present disclosure. All the components of the display device according to all embodiments of the present disclosure are operatively coupled and configured.

Referring to FIG. 1, a display device 100 includes a flexible substrate 110, a barrier film 130, a polarizing layer 150, a first back plate 122, a conductive layer 121, a second back plate 124, a supporting member 123, a coating layer 140, a flexible film 160, a printed circuit board 170, and a connecting member 171.

The flexible substrate 110 has flexibility and supports various elements of the display device 100. For example, the flexible substrate 110 can be made of a plastic material such as polyimide (PI) or the like.

Referring to FIG. 1, the flexible substrate 110 includes an active area A/A and a non-active area N/A.

The active area A/A is defined as an area for displaying an image, in which a plurality of pixels is disposed. In the active area AA, display elements for displaying images, and circuitry for driving the display elements can be disposed. For example, when the display device 100 is an organic light-emitting display device 100, the display elements can include organic light-emitting elements. On the other hand, when the display device 100 is a liquid-crystal display device, the display elements can include liquid-crystal layers or molecules. In the following description, organic light-emitting display devices will be described as examples of the display devices 100, 300, 400, 500 and 600 according to various exemplary embodiments of the present disclosure. It is, however, to be understood that the present disclosure is not limited thereto and includes other variations such as liquid crystal display devices. The circuitry can include a variety of thin-film transistors, capacitors and wirings for driving the organic light-emitting elements. For example, the circuitry can include, but is not limited to, a driving thin-film transistor, a switching thin-film transistor, a storage capacitor, a gate line, a data line, and the like. It is, however, to be understood that the present disclosure is not limited thereto and includes other examples.

In the non-active area N/A which does not display images, circuitry, wirings and elements for driving the display elements in the active area A/A are disposed. A variety of ICs such as a gate driver IC and a data driver IC and driver circuits can be disposed in the non-active area N/A. For example, a variety of ICs and driver circuits can be mounted in the non-active area N/A of the flexible substrate 110 as a GIP (Gate In Panel) or can be connected to the flexible substrate 110 by using TCP (Tape Carrier Package), COF (Chip On Film) or the like.

In the following description, in the display devices according to exemplary embodiments of the present disclosure, it is assumed that a driving IC is mounted on a flexible film 160 by the COF packaging for convenience of illustration. It is, however, to be understood that the present disclosure is not limited thereto and includes other variations.

At least a part of the non-active area N/A includes a bending area. The bending area is where the display device is to be bent after it is fabricated. Since no image is displayed in the non-active area N/A, it does not need to be seen on the upper surface of the display device 100, and at least a part of the non-active area N/A of the flexible substrate 110 can be bent.

Although only a part of the non-active area N/A is shown as the bending area in FIG. 1 for convenience of illustration. However, the entire non-active area N/A of the flexible substrate 110 can be defined as the bending area in order to reduce the size of the non-active area N/A of the flexible substrate 110 that can be seen on the upper surface of the display device 100.

The barrier film 130 is disposed on the flexible substrate. The barrier film 130 is an element for protecting a variety of elements of the display device 100. The barrier film 130 can be disposed to cover at least the active area A/A of the display device 100.

For example, the barrier film 130 can contain an adhesive material. The adhesive material can be a thermosetting adhesive or naturally-curing adhesive. In addition, the barrier film 130 can be made of a material such as PSA (pressure sensitive adhesive). The barrier film 130 can serve to fix the polarizing layer 150 on the barrier film 130. The barrier film 130 can have, but is not limited to, a thickness of at least approximately 150 µm. Further, the barrier film 130 can be disposed to protect a larger area than the active area A/A.

The coating layer 140 is an element for preventing moisture permeation into the non-active area N/A of the flexible substrate 110 and cracks in the wirings. The coating layer 140 can be disposed to cover at least the bending area of the non-active area N/A. The coating layer 140 can be made of an insulating material, e.g., an organic material.

The polarizing layer 150 is disposed on the barrier film 130 to reduce reflection of external light incident on the display device 100. When the display device 100 is used in an outdoor situation, natural light can be reflected off a reflective layer included in the anode of the organic light-emitting element or reflected off an electrode made of a metal disposed under the organic light-emitting element. When this happens, the image of the display device 100 cannot be clearly seen due to the light reflected inside the display device 100. The polarizing layer 150 allows the light waves incident from the outside in a particular direction to pass and prevents the light reflected inside the display device 100 from exiting back to the outside of the display device 100. The polarizing layer 150 can be, but is not limited to being, disposed in the active area A/A, and other variations are possible. In addition, the configuration of the display device 100 shown in FIG. 1 is merely illustrative. The polarizing layer 150 can be eliminated in some implementations of the display device 100.

The first back plate 122 and the second back plate 124 are disposed under the flexible substrate 110. When the flexible substrate 110 is made of a plastic material such as polyimide, a support substrate made of glass is disposed under the flexible substrate 110 during the process of fabricating the display device 100. The support substrate can be separated and released after the process has been completed. After the support substrate is released, it is still necessary to dispose an element to support the flexible substrate 110. Accordingly, the first back plate 122 and the second back plate 124 for supporting the flexible substrate 110 can be disposed under the flexible substrate 110.

The first back plate 122 can be disposed under the active area A/A so that the active area A/A of the flexible substrate 110 keeps a flat shape. The second back plate 124 can be disposed to support the non-active area N/A of the flexible substrate 110 excluding the bending area. As shown in FIG. 1, when the non-active area N/A of the flexible substrate 110 is bent, the second back plate 124 can be located under and overlapped with the first back plate 122.

The first back plate 122 and the second back plate 124 can be made of, but is not limited to, a plastic thin film formed of polyimide, polyethylene naphthalate (PEN), polyethylene terephthalate (PET), polymers, a combination thereof, etc.

The supporting member 123 supports the first back plate 122 and the second back plate 124. The supporting member 123 is disposed between the first back plate 122 and the second back plate 124 and comes in contact with one surface of the first back plate 122 and one surface of the second back plate 124. The curvature of the bending area can be determined as the lower surface of the second back plate 124 is fixed to the supporting member 123 fixed to the lower surface of the first back plate 122.

The conductive layer 121 is disposed on the upper surface of the first back plate 122. In other words, the conductive layer 121 is disposed between the first back plate 122 and the flexible substrate 110. Each of the sides of the first back plate 122 overlaps with the respective sides of the conductive layer 121, such that the first back plate 122 can cover the conductive layer 121. It is to be noted that although the first back plate 122 and the conductive layer 121 have the same area and are overlapped with each other in FIG. 1, the sides of the first back plate 122 cannot overlap with the sides of the conductive layer 121. The area of the conductive layer 121 can be, but is not limited to being, larger or smaller than the first back plate 122.

The conductive layer 121 is made of a conductive material and can receive a voltage from the printed circuit board 170. By applying a voltage to the conductive layer 121, the conductive layer 121 and the first back plate 122 on which the conductive layer 121 is disposed can work as a polarization-mitigating structure for reducing the polarization of the flexible substrate 110. A detailed description thereof will be given later with reference to FIG. 2.

The first back plate 122 includes a contact hole CH. The first back plate 122 completely overlaps the conductive layer 121 so that the conductive layer 121 is not exposed. Accordingly, in order to apply a voltage to the conductive layer 121, the contact hole CH via which the conductive layer 121 is exposed from the first back plate 122 can be formed in the first back plate 122.

A conductive part 180 is embedded in the contact hole CH. The contact hole CH is filled with the conductive part 180 which is connected to the conductive layer 121. The conductive part 180 can be made of a conductive material.

The flexible film 160 is connected to one end of the non-active area N/A of the flexible substrate 110. The flexible film 160 is formed by disposing various components on a flexible film, and is an element for supplying signals to the pixels in the active area A/A. A variety of ICs such as a gate driver IC and a data driver IC and driver circuits can be disposed on the flexible film 160.

The printed circuit board 170 is connected to the flexible film 160. The printed circuit board 170 supplies a driving voltage, a data voltage, etc. for driving the display elements of the flexible substrate 110 to the driver IC of the flexible film 160. A variety of elements can be disposed on the printed circuit board 170. For example, a timing controller, a power supply unit, a gamma voltage generator, and the like can be disposed on the printed circuit board 170.

The connecting member 171 connects the printed circuit board 170 with the conductive layer 121. The conductive layer 121 can receive a voltage from the printed circuit board 170 through the connecting member 171. For example, the connecting member 171 can be a pad electrode disposed on the printed circuit board 170. It is, however, to be understood that the connecting member 171 is not particularly limited as long as it can transmit a voltage from the printed circuit board 170 to the conductive layer 121.

As shown in FIG. 1, the flexible film 160 can be bent toward the first back plate 122, and thus the printed circuit board 170 connected to the end of the flexible film 160 can also be disposed close to the first back plate 122. The connecting member 171 of the printed circuit board 170 comes in contact with the conductive part 180 embedded in the contact hole CH of the first back plate 122. The connecting member 171 of the printed circuit board 170 can be electrically connected to the conductive layer 121 connected to the conductive part 180. Accordingly, the printed circuit board 170 can be electrically connected to the conductive layer 121 through the connecting member 171 and the conductive part 180.

A constant voltage is applied to the conductive layer 121 from the printed circuit board 170 through the connecting member 171 and the conductive part 180. The applied voltage can be equal to the voltage applied to a source electrode SE or a drain electrode DE. For example, the voltage applied to the conductive layer 121 can be equal to a VDD voltage applied to the source electrode SE. When the voltage applied to the conductive layer 121 is equal to the voltage applied to the source electrode SE, the difference between the voltage applied to the conductive layer 121 and the voltages applied to the source electrode SE, an active layer ACT and the drain electrode DE of the thin-film transistor TFT is decreased, thereby reducing the electric field between the conductive layer 121 and the thin-film transistor TFT and accordingly suppressing a polarization resulted from the electric field. Although the VDD voltage has been described as an example of the voltage applied to the conductive layer 121, it is to be understood that a constant voltage different from the VDD voltage can be applied to the conductive layer 121.

Further, an adhesive layer can be disposed between the polarizing layer 150 and the barrier film 130, between the barrier film 130 and the flexible substrate 110, between the flexible substrate 110 and the conductive layer 121, between the conductive layer 121 and the first back plate 122, between the first back plate 122 and the supporting member 123, between the supporting member 123 and the second back plate 124, and between the second back plate 124 and the flexible substrate 110.

Hereinafter, an example where a voltage is applied to the conductive layer 121 will be described in detail with reference to FIG. 2.

Figure 2:
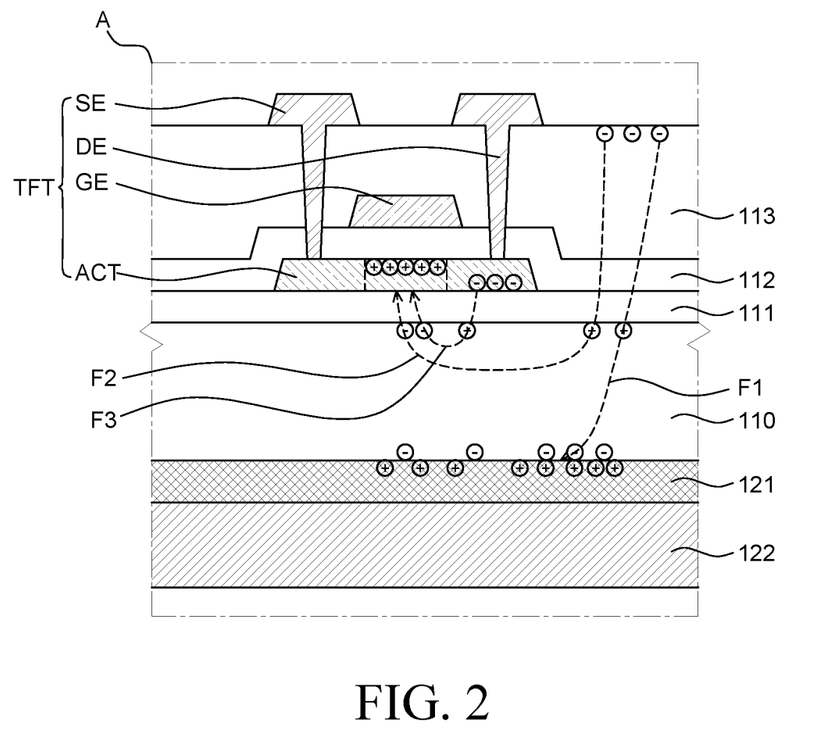
FIG. 2 is an enlarged view of area A of FIG. 1.

FIG. 2 is an enlarged view of area A of FIG. 1.

Referring to FIG. 2, the flexible substrate 110 includes a buffer layer 111, a thin-film transistor TFT, a gate insulating layer 112, an interlayer insulating layer 113, a planarization layer, an organic light-emitting element, and a bank.

The buffer layer 111 is disposed on the flexible substrate 110. The buffer layer 111 can prevent permeation of moisture or impurities through the flexible substrate 110. The buffer layer 111 can be made up of, but is not limited to, a single layer or a plurality of layers of silicon oxide (SiOx) or silicon nitride (SiNx). The buffer layer 111 can be eliminated in some implementations.

The thin-film transistor TFT includes a gate electrode GE, an active layer ACT, a source electrode SE and a drain electrode DE.

The active layer ACT of the thin-film transistor TFT is disposed on the flexible substrate 110. The active layer ACT can include oxide semiconductor, amorphous silicon, poly-silicon, or the like.

The gate insulating layer 112 is disposed on the active layer ACT. The gate insulating layer 112 is a layer for insulating the gate electrode GE from the active layer ACT, and can be made of an insulating material. For example, the gate insulating layer 112 can be made up of, but is not limited to, a single layer or a plurality of layers of silicon oxide (SiOx) or silicon nitride (SiNx).

The gate electrode GE is disposed on the gate insulating layer 112. The gate electrode GE can be made of, but is not limited to, a conductive material, e.g., copper (Cu), aluminum (Al), molybdenum (Mo), titanium (Ti), or an alloy thereof.

The interlayer insulating layer 113 is disposed on the gate electrode GE. The interlayer insulating layer 113 is a layer for insulating the gate electrode GE from the source electrode SE and the drain electrode DE and can be made of an insulating material. For example, the interlayer insulating layer 113 can be made up of, but is not limited to, a single layer or a plurality of layers of silicon oxide (SiOx) or silicon nitride (SiNx).

The source electrode 123 and the drain electrode 124 are disposed on the interlayer insulating layer 113 such that they are spaced apart from each other. The source electrode SE and the drain electrode DE can be electrically connected to the active layer ACT. The source electrode SE and the drain electrode DE can be made of, but is not limited to, a conductive material, e.g., copper (Cu), aluminum (Al), molybdenum (Mo), titanium (Ti), or an alloy thereof.

Incidentally, an organic light-emitting element electrically connected to the thin-film transistor TFT can be disposed on the thin-film transistor TFT. The organic light-emitting element includes an anode, an organic emission layer, and a cathode. The anode can be electrically connected to the source electrode SE or the drain electrode DE to drive the organic light-emitting element. That is, the thin-film transistor TFT can supply a voltage for driving the organic light-emitting element.

The thin-film transistor TFT can be turned on or off depending on the voltage applied to the gate electrode GE. For example, when no voltage is applied to the gate electrode GE, electrons and holes are randomly arranged in the active layer ACT overlapping with the gate electrode GE. When this time, even if a voltage is applied to the source electrode SE, no channel region that is a passage through which electrons can move is formed in the active layer ACT, such that electrons cannot move from the source electrode SE toward the drain electrode DE.

On the other hand, when a voltage is applied to the gate electrode GE, holes can be gathered in the vicinity of the upper surface of the active layer ACT which is closest to the gate electrode GE, such that a channel region can be formed in the vicinity of the lower surface of the active layer ACT where electrons can move. When a voltage is applied to the source electrode SE or the drain electrode DE after the channel region is formed, the electrons can move to the drain electrode DE or the source electrode SE through the channel region of the active layer ACT.

Incidentally, a number of wirings and components are disposed on the flexible substrate 110, in addition to the thin-film transistor TFT. A voltage is applied to each of them, and thus various electric fields can be formed. The flexible substrate 110 can be affected by the various electric fields, such that electrons can be gathered in some areas, and holes can be gathered in other areas, that is, a polarization can occur, which forms another electric field. The electric field formed in the flexible substrate 110 can affect the characteristics of the thin-film transistor TFT among various elements disposed on the flexible substrate 110.

For example, a polarization can occur by a second electric field F2 and a third electric field F3 in some regions of the upper portion of the flexible substrate 110 overlapped with the thin-film transistor TFT. The second electric field F2 is formed between the holes in the central portion of the active layer ACT and the electrons in the vicinity of the upper surface of the flexible substrate 110 adjacent to the central portion of the active layer ACT. A polarization can occur as electrons are gathered in the upper portion of the flexible substrate 110 overlapping with the central portion of the active layer ACT by the second electric field F2. As the polarization occurs, some of the holes in the active layer ACT can be arranged in the vicinity of the lower surface rather than the upper surface of the active layer ACT.

The third electric field F3 is formed among the electrons in the drain region of the active layer ACT connected to the drain electrode DE, the electrons in the vicinity of the upper surface of the flexible substrate 110 adjacent to the drain region of the active layer ACT, the holes in the vicinity of the upper surface of the flexible substrate 110 adjacent to the central portion of the active layer ACT, and the holes in the central portion of the active layer ACT. A polarization can occur in the vicinity of the upper surface of the flexible substrate 110 by the third electric field F3. Like the polarization by the second electric field F2, the polarization by the third electric field F3 can also affect the active layer ACT.

As a result, the second electric field F2 and the third electric field F3 of the flexible substrate 110 can affect the formation of the channel region of the thin-film transistor TFT. Accordingly, the second electric field F2 and the third electric field F3 can hinder the movement of the electrons in the channel region. Particularly, when the thin-film transistor TFT is a driving thin-film transistor TFT for precisely controlling the grayscale of the organic light-emitting element, the polarizations in the flexible substrate 110 resulted by the second electric field F2 and the third electric field F3 affect the channel region of the active layer ACT, such that it can become difficult to control the organic light-emitting element. As a result, a residual image can occur when the display device 100 displays images.

When a voltage is applied to the conductive layer 121 to supply holes, a first electric field F1 can be formed between the vicinity of the lower surface of the flexible substrate 110 and the conductive layer 121. Specifically, the first electric field F1 is formed between the electrons of the flexible substrate 110 and the holes of the conductive layer 121, and electrons can be gathered in the vicinity of the lower surface of the flexible substrate 110. When the electrons are gathered in the vicinity of the lower surface of the flexible substrate 110, electric field formation between the holes in the active layer ACT of the thin-film transistor TFT on the flexible substrate 110 and the electrons in the vicinity of the upper surface of the flexible substrate 110 is reduced, such that the polarization can become weaker.

In view of the above, in the display device 100 according to an exemplary embodiment of the present disclosure, the conductive layer 121 is disposed on the first back plate 122 disposed below the flexible substrate 110. Then, by applying a voltage to the conductive layer 121, the polarization occurring on the flexible substrate 110 can become weaker. For example, a polarization can occur in the vicinity of the upper surface of the flexible substrate 110 by the electric field formed between the flexible substrate 110 and the thin-film transistor TFT. At this time, if the polarizations resulted by the first electric field F1 and the second electric field F2 formed adjacent to the active layer ACT in the vicinity of the upper surface of the flexible substrate 110 affect the channel region of the thin-film transistor TFT, the electrons in the vicinity of the upper surface of the flexible substrate 110 can be moved to the vicinity of the lower surface of the flexible substrate 110 by applying a constant voltage to the conductive layer 121. As a result, the electrons in the vicinity of the upper surface of the flexible substrate 110 overlapped with the thin-film transistor TFT, which contribute to the polarization, are moved to the vicinity of the lower surface of the flexible substrate 110, such that the polarization of the flexible substrate 110 becomes weaker, thereby reducing the influence on the channel region of the thin-film transistor TFT. In this manner, the conductive layer 121 and the first back plate 122 on which the conductive layer 121 is disposed can also work as a polarization-mitigating structure for reducing the polarization of the flexible substrate 110. Accordingly, in the display device 100 according to an exemplary embodiment of the present disclosure, the polarization of the flexible substrate 110 can be reduced by applying a voltage to the conductive layer 121 under the flexible substrate 110, thereby suppressing changes in the characteristic of the thin-film transistor TFT and improving residual image issues.

In some exemplary embodiments, the conductive layer 121 can be disposed above the flexible substrate 110. Specifically, the conductive layer 121 can be disposed between the buffer layer 111 and the flexible substrate 110 above the flexible substrate 110, and the conductive layer 121 can be connected to the connecting member 171 of the printed circuit board 170 through the conductive part 180 embedded in the contact hole CH formed in the first back plate 122 and the flexible substrate 110.

Figure 3:
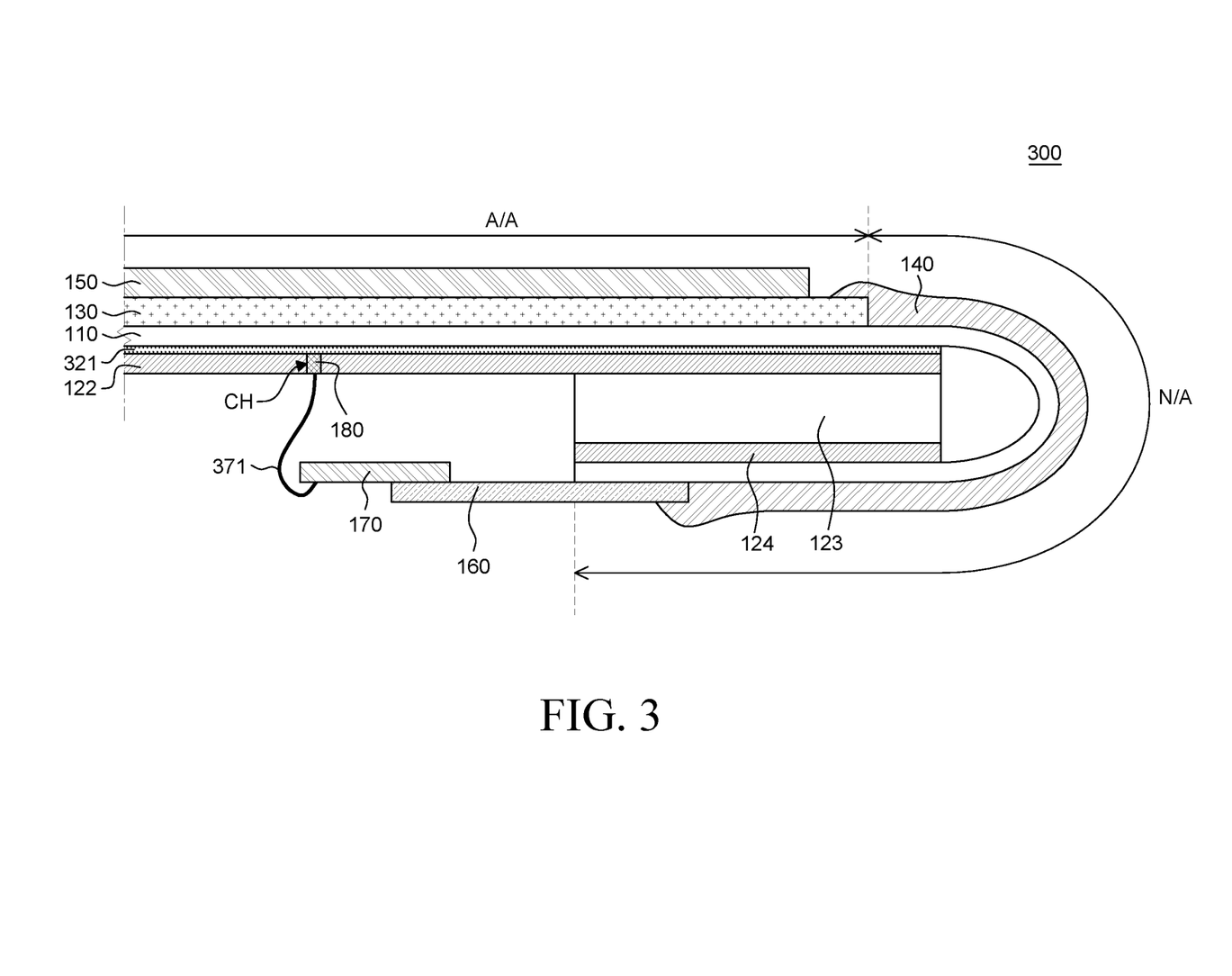
FIGS. 3 to 6 are cross-sectional views of display devices according to various exemplary embodiments of the present disclosure.

FIG. 3 is a cross-sectional view of a display device according to another exemplary embodiment of the present disclosure. A display device 300 shown in FIG. 3 is substantially identical to the display device 100 shown in FIGS. 1 and 2 except for the configuration of the conductive layer 121 and the connecting member 171. Therefore, the redundant description will be omitted or will be brief.

Referring to FIG. 3, a conductive layer 321 includes an adhesive material and conductive particles. Therefore, the conductive layer 321 can work as a conductive adhesive layer between the first back plate 122 and the flexible substrate 110. Specifically, the adhesive material of the conductive layer 321 works to attach the first back plate 122 to the flexible substrate 110. The conductive particles of the conductive layer 321 receive a constant voltage applied from the printed circuit board 170 to mitigate the polarization of the flexible substrate 110. For example, the conductive layer 321 can be, but is not limited to, anisotropic conductive film (ACF).

A connecting member 371 connects a printed circuit board 170 with the conductive layer 321. A flexible film 160 connected to one end of the non-active area N/A of the flexible substrate 110 and the printed circuit board 170 connected to the flexible film 160 are spaced apart from the first back plate 122 by a predetermined distance. Accordingly, the connecting member 371 and a conductive part 180 are disposed between the printed circuit board 170 and the conductive layer 321 to electrically connect the printed circuit board 170 with the conductive layer 321. For example, the connecting member 371 can be implemented as a wire or line and can be connected to the printed circuit board 170, the conductive part 180, and the conductive layer 321 to deliver a voltage therebetween.

In the display device 300 according to this exemplary embodiment of the present disclosure, the conductive layer 321 containing an adhesive material is disposed between the first back plate 122 and the flexible substrate 110. Accordingly, the first back plate 122 can be attached to the flexible substrate 110 while the polarization of the flexible substrate 110 can be mitigated by the conductive layer 321. The first back plate 122 supports the active area A/A of the flexible substrate 110 so that it keeps a flat shape. Since the first back plate 122 has to be attached to the flexible substrate 110, an adhesive layer is required therebetween. In contrast, in the display device 300 according to this exemplary embodiment of the present disclosure, no additional adhesive layer is disposed between the first back plate 122 and the flexible substrate 110 besides the conductive layer 321. The conductive layer 321 contains an adhesive material and conductive particles, such that the process of disposing the adhesive layer can be skipped and the structure of the display device 300 can become simpler.

Figure 4:
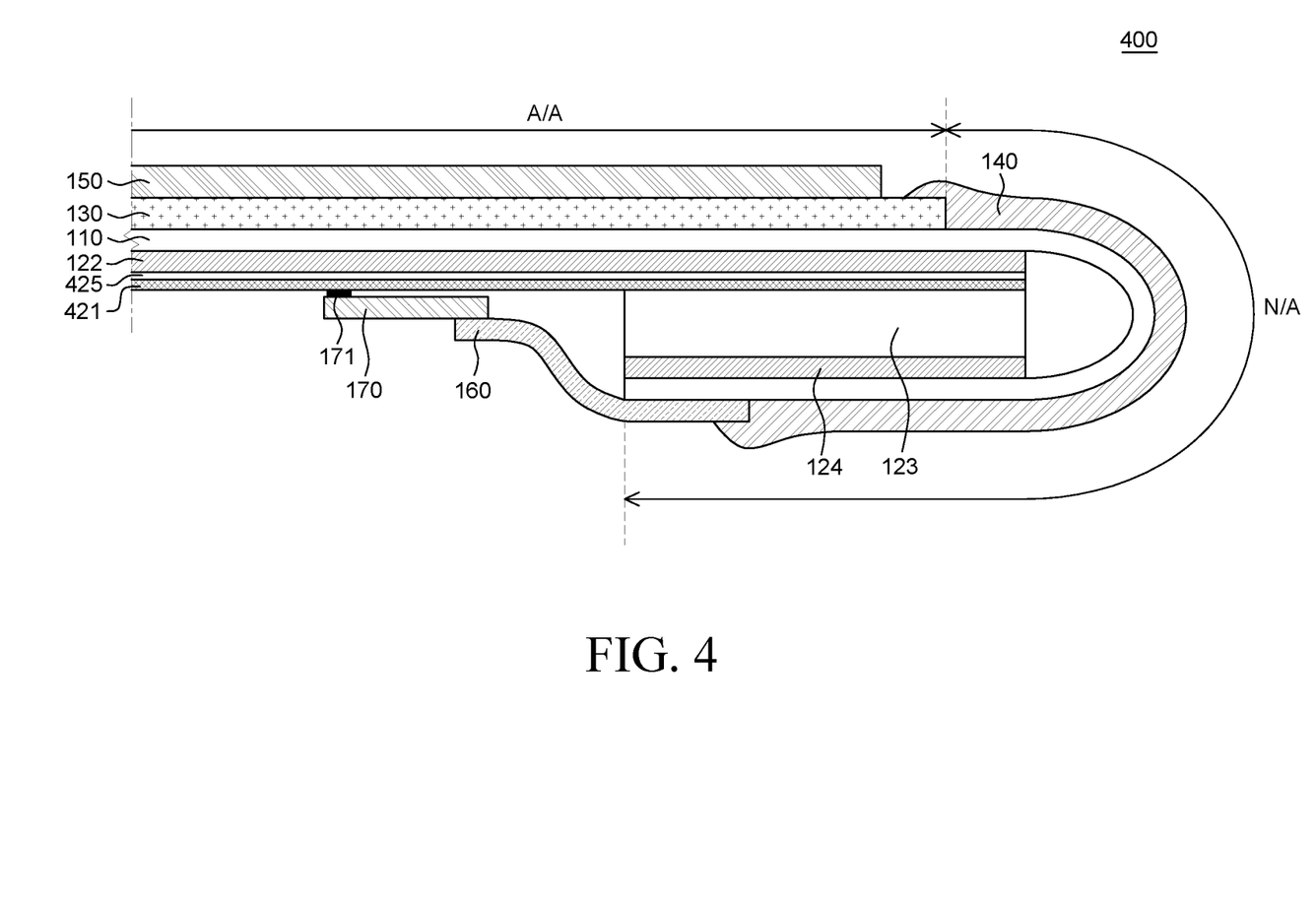

FIG. 4 is a cross-sectional view of a display device according to yet another exemplary embodiment of the present disclosure. A display device 400 shown in FIG. 4 is substantially identical to the display device 100 shown in FIGS. 1 to 2 except that a conductive layer 421 is located at a different position, and that a shock-absorbing layer 425 is further included. Therefore, the redundant description will be omitted or will be brief.

Referring to FIG. 4, the conductive layer 421 is disposed on the lower surface of the first back plate 122. Since the conductive layer 421 is disposed at the bottom of the display device 400 and is exposed to the outside, the conductive layer 421 can efficiently dissipate heat. As the display device 400 is driven, current flows and thus heat is generated. In order to efficiently discharge the heat to the outside, the conductive layer 421 can be used as a heat dissipating member for discharging heat on the outermost surface of the display device 400. In other words, the conductive layer 421 can work as a heat dissipation plate while mitigating the polarization of the flexible substrate 110. As the conductive layer 421, a metal having a high thermal conductivity can be used.

The shock-absorbing layer 425 is disposed between the conductive layer 421 and the first back plate 122. The shock-absorbing layer 425 is an element that protects the elements of the display device 400 by absorbing a physical impact or blocking heat. For example, the shock-absorbing layer 425 can include bubbles. The bubbles can effectively absorb the physical impact applied to the display device 400. The shock-absorbing layer 425 can be formed of, but is not limited to, acrylic foam.

In the display device 400 according to this exemplary embodiment of the present disclosure, the conductive layer 421 and the shock-absorbing layer 425 are disposed on the lower surface of the first back plate 122. The conductive layer 421 can work as a heat dissipating member for discharging heat while mitigating the polarization of the flexible substrate 110. In addition, the shock-absorbing layer 425 can absorb shock or block heat between the conductive layer 421 and the flexible substrate 110. Therefore, in the display device 400 according to this exemplary embodiment of the present disclosure, the conductive layer 421 disposed under the first back plate 122 can work as the heat dissipating member for mitigating the polarization of the flexible substrate 110, and thus the conductive layer 421 can discharge the heat generated in the display device 400 without no additional heat discharging member.

Figure 5:
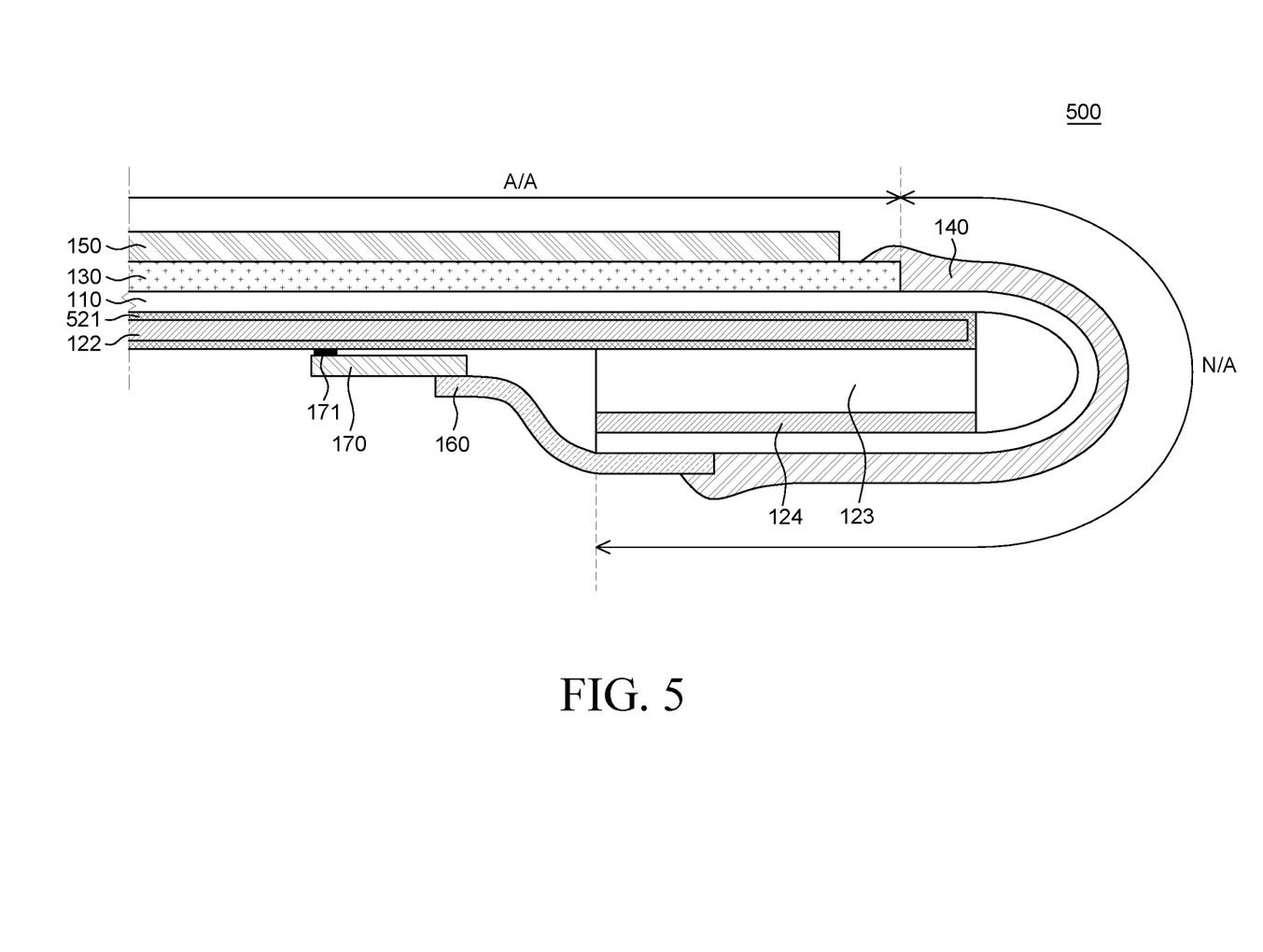

FIG. 5 is a cross-sectional view of a display device according to yet another exemplary embodiment of the present disclosure. A display device 500 shown in FIG. 5 is substantially identical to the display device 100 shown in FIGS. 1 and 2 except for the position and the shape of a conductive layer 521. Therefore, the redundant description will not be made or will be brief.

Referring to FIG. 5, the conductive layer 521 is disposed along the entire surfaces of the first back plate 122. Specifically, the conductive layer 521 can be disposed on the upper surface, lower surface and side surfaces of the first back plate 122 as a single continuous piece. Therefore, the conductive layer 521 is not covered by the first back plate 122 but can be exposed to the outside. When a voltage is applied to a portion of the conductive layer 521 on the lower surface of the first back plate 122 through the connecting member 171, the voltage can also be applied to a portion of the conductive layer 521 on the upper surface of the first back plate 122. Therefore, it is not necessary to form a separate contact hole CH for exposing the conductive layer 521 in the first back plate 122.

In the display device 500 according to this exemplary embodiment of the present disclosure, the conductive layer 521 is disposed on the entire surface of the first back plate 122. Accordingly, the conductive layer 521 can be connected to the printed circuit board 170 without forming any contact hole in the first back plate 122. The efficiency of mitigating the polarization of the flexible substrate 110 can be increased as the conductive layer 521 is disposed closer to the flexible substrate 100. In addition, in the display device 500 according to this exemplary embodiment of the present disclosure, the conductive layer 521 surrounds the entire surfaces of the first back plate 122, and accordingly if a voltage is applied to the portion of the conductive layer 521 exposed to the outside under the first back plate 133, the voltage can also be applied to the portion of the conductive layer 521 between the first back plate 122 and the flexible substrate 110. Accordingly, the process for electrically connecting the conductive layer 521 with the printed circuit board 170 can be simplified.

Figure 6:
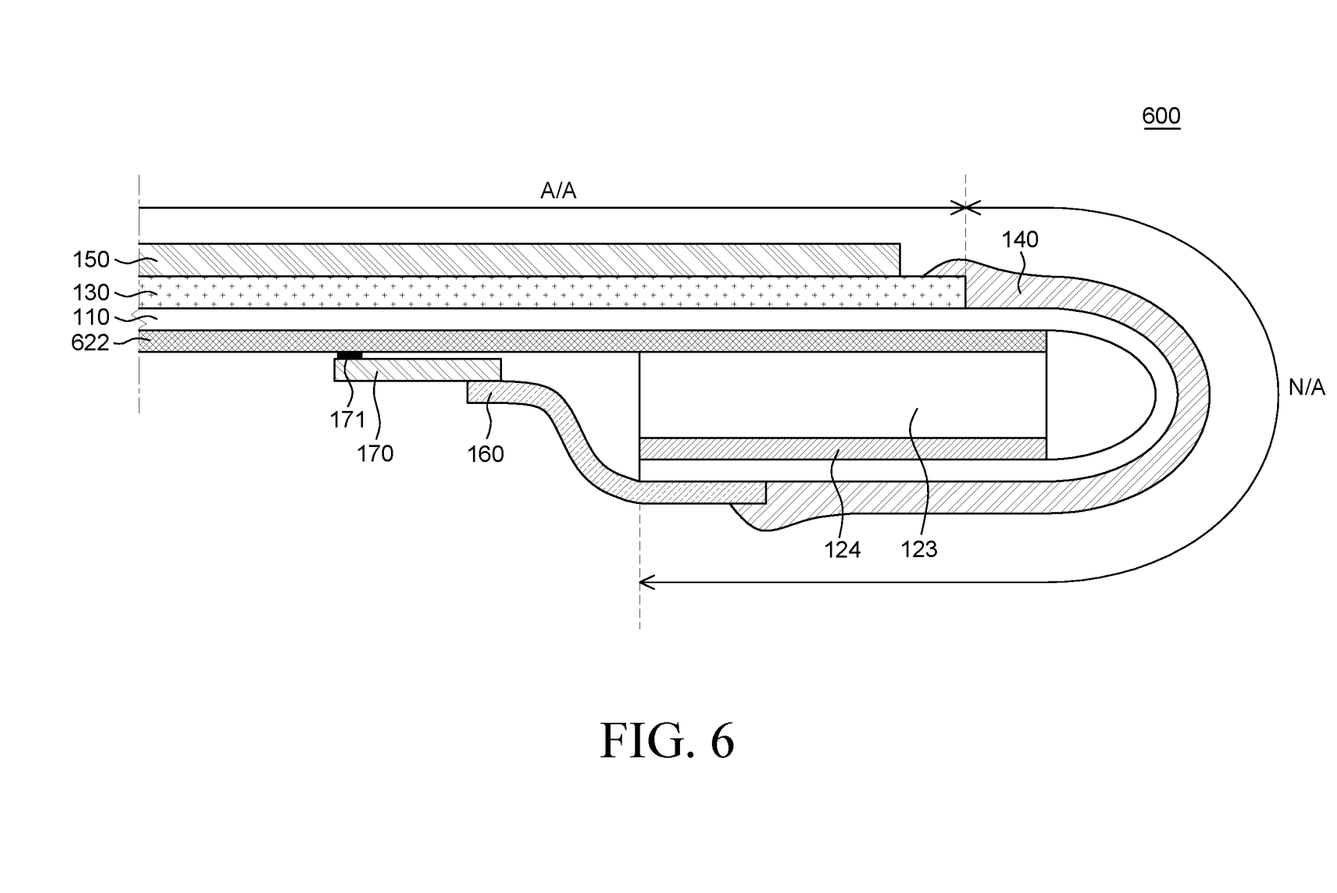

FIG. 6 is a cross-sectional view of a display device according to yet another exemplary embodiment of the present disclosure. A display device 600 shown in FIG. 6 is substantially identical to the display device 100 shown in FIGS. 1 and 2 except that no conductive layer is disposed and that a first back plate 622 is made of a different material. Therefore, the redundant description will be omitted or will be brief.

Referring to FIG. 6, the first back plate 622 is made of a conductive material. That is to say, instead of disposing the first back plate 622 and the conductive layer separately, the first back plate 622 can also work as a conductive layer. The first back plate 622 made of a conductive material can support the active area A/A of the flexible substrate 110 so that it keeps a flat shape.

Although the flexible substrate 110 keeps a flat shape by the first back plate 622, it can sometimes be bent flexibly. Accordingly, the first back plate 622, which also works as a conductive layer, is formed as a very thin film, so that it can be bent along with the flexible substrate 110.

In the display device 600 according to this exemplary embodiment of the present disclosure, the first back plate 622, which can also work as a conductive layer, is disposed under the flexible substrate 110. Previously, a first back plate was made of an insulating material such as plastic, and a conductive layer was disposed between the flexible substrate and the first back plate in order to apply a voltage for mitigating the polarization of the flexible substrate 110. In contrast, instead of forming the first back plate and the conductive layer separately, the first back plate 622 can also work as the conductive layer by making the first back plate 622 with a conductive material. In this manner, in the display device 600 according to this exemplary embodiment of the present disclosure, the first back plate 622 working as a conductive layer is disposed under the flexible substrate 110, to thereby simplify the process for forming the conductive layer. In addition, since the first back plate 622 working as the conductive layer is disposed in contact with the flexible substrate 110, the efficiency of mitigating the polarization of the flexible substrate 110 can be increased.

The exemplary embodiments of the present disclosure can also be described as follows.

According to an aspect of the present disclosure, a display device includes a flexible substrate, a back plate disposed under the flexible substrate to support the flexible substrate, a conductive layer disposed on at least one surface of the back plate, and a printed circuit board connected to one side of the flexible substrate. The conductive layer is electrically connected to the printed circuit board and receives a constant voltage applied thereto.

The conductive layer can be disposed so as to surround all of the surfaces of the back plate.

The conductive layer can be disposed between the flexible substrate and the back plate.

The conductive layer can be electrically connected to the printed circuit board through a conductive part embedded in a contact hole formed in the back plate.

The conductive layer can contain an adhesive material for attaching the flexible substrate to the back plate, and conductive particles.

The display device can further include a shock-absorbing layer disposed between the conductive layer and the back plate, and the conductive layer is configured to discharge heat generated in the display device.

The display device can further include a thin-film transistor disposed on the flexible substrate and comprising a gate electrode, an active layer, a source electrode and a drain electrode, wherein the active layer is disposed between the flexible substrate and the gate electrode.

The thin film transistor can be a driving thin film transistor, and a voltage applied to the conductive layer from the printed circuit board is equal to a VDD voltage applied to either the source electrode or the drain electrode.

According to an another aspect of the present disclosure, a display device includes a flexible substrate comprising an active area, and a non-active area having a bending area; a printed circuit board connected to one side of the flexible substrate; and a polarization-mitigating structure for supporting the active area and the non-active area of the flexible substrate excluding the bending area, and receiving a voltage from the printed circuit board.

The polarization-mitigating structure can include a back plate disposed under the flexible substrate, and a conductive layer disposed on at least one surface of the back plate.

The conductive layer can be disposed so as to surround all of the surfaces of the back plate.

The conductive layer can be disposed between the flexible substrate and the back plate, and the back plate can include a contact hole for electrically connecting the conductive layer with the printed circuit board.

The conductive layer can contain an adhesive material and conductive particles, and the conductive layer can serve as an adhesive layer between the flexible substrate and the back plate.

The conductive layer can be disposed on a lower surface of the back plate, wherein the conductive layer can further include a shock-absorbing layer disposed between the back plate and the conductive layer, and the conductive layer can discharge heat generated in the display device.

The polarization-mitigating structure can include a back plate disposed under the flexible substrate, and the back plate can be made of a conductive material.

The voltage applied to the polarization-mitigating structure can be a constant voltage.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. Therefore, it should be understood that the above-described embodiments are not limiting but illustrative in all aspects. The scope of protection sought by the present disclosure is defined by the appended claims and all equivalents thereof are construed to be within the true scope of the present disclosure.

What is claimed is:

1. A display device comprising:
    a flexible substrate;
    a back plate disposed under the flexible substrate to support the flexible substrate;
    a conductive layer disposed on at least one surface of the back plate; and
    a printed circuit board connected to one side of the flexible substrate,
    wherein the conductive layer is electrically connected to the printed circuit board and receives a constant voltage applied thereto.

2. The display device of claim 1, wherein the conductive layer is disposed so as to surround all of the surfaces of the back plate.

3. The display device of claim 1, wherein the conductive layer is disposed between the flexible substrate and the back plate.

4. The display device of claim 3, wherein the conductive layer is electrically connected to the printed circuit board through a conductive part embedded in a contact hole formed in the back plate.

5. The display device of claim 3, wherein the conductive layer contains an adhesive material for attaching the flexible substrate to the back plate, and further contains conductive particles.

6. The display device of claim 1, further comprising:
    a shock-absorbing layer disposed between the conductive layer and the back plate,
    wherein the conductive layer is configured to discharge heat generated in the display device.

7. The display device of claim 1, further comprising:
    a thin-film transistor disposed on the flexible substrate and comprising a gate electrode, an active layer, a source electrode and a drain electrode,
    wherein the active layer is disposed between the flexible substrate and the gate electrode of the thin-film transistor.

8. The display device of claim 7, wherein the thin-film transistor is a driving thin-film transistor, and
    wherein a voltage applied to the conductive layer from the printed circuit board is equal to a VDD voltage applied to either the source electrode of the thin-film transistor or the drain electrode of the thin-film transistor.

9. A display device comprising:
    a flexible substrate comprising an active area, and a non-active area having a bending area;
    a printed circuit board connected to one side of the flexible substrate; and
    a polarization-mitigating structure for supporting the active area and the non-active area of the flexible substrate excluding the bending area, and receiving a voltage from the printed circuit board,
    wherein the polarization-mitigating structure comprises:
        a back plate disposed under the flexible substrate; and
        a conductive layer disposed on at least one surface of the back plate.

10. The display device of claim 9, wherein the conductive layer is disposed so as to surround all of the surfaces of the back plate.

11. The display device of claim 9, wherein the conductive layer is disposed between the flexible substrate and the back plate, and wherein the back plate comprises a contact hole for electrically connecting the conductive layer with the printed circuit board.

12. The display device of claim 11, wherein the conductive layer contains an adhesive material and conductive particles, and
wherein the conductive layer serves as an adhesive layer between the flexible substrate and the back plate.

13. The display device of claim 9, wherein the conductive layer is disposed on a lower surface of the back plate,
wherein the conductive layer further comprises a shock-absorbing layer disposed between the back plate and the conductive layer, and
wherein the conductive layer discharges heat generated in the display device.

14. The display device of claim 9, wherein the back plate is made of a conductive material.

15. The display device of claim 9, wherein the voltage applied to the polarization-mitigating structure is a constant voltage.

* * * * *